United States Patent
Huang et al.

(10) Patent No.: US 10,692,976 B2
(45) Date of Patent: Jun. 23, 2020

(54) GAN-ON-SI SWITCH DEVICES

(71) Applicant: NXP USA, Inc., Austin, TX (US)

(72) Inventors: Jenn Hwa Huang, Chandler, AZ (US); Weixiao Huang, Tempe, AZ (US)

(73) Assignee: NXP USA, Inc., Austin, TX (US)

( * ) Notice: Subject to any disclaimer, the term of this patent is extended or adjusted under 35 U.S.C. 154(b) by 0 days.

(21) Appl. No.: 15/422,254

(22) Filed: Feb. 1, 2017

(65) Prior Publication Data
US 2017/0141190 A1 May 18, 2017

Related U.S. Application Data

(62) Division of application No. 13/276,875, filed on Oct. 19, 2011, now Pat. No. 9,601,638.

(51) Int. Cl.
| | |
|---|---|
| H01L 29/66 | (2006.01) |
| H01L 29/10 | (2006.01) |
| H01L 29/20 | (2006.01) |
| H01L 29/812 | (2006.01) |
| H01L 21/265 | (2006.01) |
| H01L 21/266 | (2006.01) |
| H01L 21/306 | (2006.01) |

(Continued)

(52) U.S. Cl.
CPC ........ H01L 29/1083 (2013.01); H01L 21/266 (2013.01); H01L 21/2654 (2013.01); H01L 21/308 (2013.01); H01L 21/30612 (2013.01); H01L 23/291 (2013.01); H01L 23/3171 (2013.01); H01L 29/1037 (2013.01); H01L 29/2003 (2013.01); H01L 29/66522 (2013.01); H01L 29/66863 (2013.01); H01L 29/812 (2013.01); H01L 21/26506 (2013.01); H01L 29/517 (2013.01); H01L 29/66462 (2013.01)

(58) Field of Classification Search
CPC .. H01L 29/1083; H01L 29/1037; H01L 29/94
See application file for complete search history.

(56) References Cited

U.S. PATENT DOCUMENTS

| | | | |
|---|---|---|---|
| 3,974,515 A * | 8/1976 | Ipri | .......................... H01L 21/86 257/353 |
| 5,292,670 A | 3/1994 | Sundaresan | |

(Continued)

FOREIGN PATENT DOCUMENTS

JP 06104458 A * 4/1994

OTHER PUBLICATIONS

Pearton. S.J. et al., "Ion Implantation Doping and Isolation of GaN", Appl. Phys. Lett., vol. 67, No. 10, pp. 1435-1437 (Sep. 1995).

(Continued)

*Primary Examiner* — Lex H Malsawma
*Assistant Examiner* — Laura M Dykes
(74) *Attorney, Agent, or Firm* — Bruce M. Green

(57) ABSTRACT

A low leakage current switch device (110) is provided which includes a GaN-on-Si substrate (11, 13) with one or more device mesas (41) in which isolation regions (92, 93) are formed using an implant mask (81) to implant ions (91) into an upper portion of the mesa sidewalls and the peripheral region around each elevated surface of the mesa structures exposed by the implant mask, thereby preventing the subsequently formed gate electrode (111) from contacting the peripheral edge and sidewalls of the mesa structures.

16 Claims, 6 Drawing Sheets

(51) Int. Cl.
    *H01L 21/308*     (2006.01)
    *H01L 23/29*     (2006.01)
    *H01L 23/31*     (2006.01)
    *H01L 29/51*     (2006.01)

(56) References Cited

U.S. PATENT DOCUMENTS

| | | |
|---|---|---|
| 5,346,839 A | 9/1994 | Sundaresan |
| 5,356,823 A * | 10/1994 | Mitani .............. H01L 21/28587 |
| | | 148/DIG. 131 |
| 2003/0151063 A1 | 8/2003 | Kobayashi |
| 2005/0133818 A1 | 6/2005 | Johnson et al. |
| 2005/0145851 A1 | 7/2005 | Johnson et al. |
| 2005/0161704 A1* | 7/2005 | Hoshi ............... H01L 29/66462 |
| | | 257/192 |
| 2006/0237753 A1 | 10/2006 | Anda et al. |
| 2007/0241419 A1 | 10/2007 | Green et al. |
| 2008/0258243 A1* | 10/2008 | Kuroda ............. H01L 29/42376 |
| | | 257/410 |
| 2009/0166678 A1* | 7/2009 | Sato ................... H01L 21/8252 |
| | | 257/194 |

OTHER PUBLICATIONS

Hanington, G. et al., "P/He ion implant isolation technology for AlGaN/GaN HFETs", Electronics Letters, vol. 34, No. 2, pp. 193-195 (Jan. 22, 1998).

Dettmer, R. et al., "Heterojunction Bipolar Transistor Isolation by Boron Implant", Conference proceedings of the International Conference on Compound Semiconductor Manufacturing Technology, GaAS Mantech, pp. 223-225 (1998).

\* cited by examiner

GAN-ON-SI SWITCH DEVICES

RELATED APPLICATION

This application is a divisional of co-pending, U.S. patent application Ser. No. 13/276,875, filed on Oct. 19, 2011.

BACKGROUND OF THE INVENTION

Field of the Invention

The present invention is directed in general to integrated circuit devices and methods for manufacturing same. In one aspect, the present invention relates to the manufacture and use of gallium nitride switch devices.

Description of the Related Art

Semiconductor devices used with high power applications, such as optoelectronic, high-power and high-frequency devices, operate at higher temperatures and work at much higher voltages than conventional transistors. To meet these operating requirements, high power semiconductor devices may be formed with semiconductor materials, such as Gallium nitride (GaN), having material properties that are suitable for use in such applications. For example, switch devices, such as MOSFET and MESFET transistors, formed with GaN based substrates offer many advantages in high power electronics, especially in automotive and electric car applications, by delivering high current, low resistance during an ON-state, but have unacceptable OFF-state gate and drain leakage currents, resulting in significant power consumption in the stand-by or reversed biased state. To illustrate the amount of leakage current, a 1 mA/mm level of OFF-state leakage will consume 60 watts for a 100 mm gate width device at a reverse bias of 600V. Devices that exhibit high leakage currents can have limited operating voltage and/or power density of the device (e.g., transistors), and typically have inferior, and oftentimes unacceptable, performance characteristics. Leakage current problems can be exacerbated with GaN based substrates which include a thick GaN epi layer and/or buffer layer (e.g., GaN/AlGaN/AlN) having defects and contaminants which provide an easy leakage current path in the devices. Attempts to reduce leakage current in such devices have used mesa isolation and implant isolation techniques which are implemented together in the fabrication process (e.g., prior to source/drain contact formation) in order to isolate thick buffer layers needed to provide strong OFF-state breakdown voltage protection, but this approach creates additional leakage current paths on the side wall of mesa and gate electrodes have to cross from low isolated regions to the elevated active regions of a device.

Further limitations and disadvantages of conventional processes and technologies will become apparent to one of skill in the art after reviewing the remainder of the present application with reference to the drawings and detailed description which follow.

BRIEF DESCRIPTION OF THE DRAWINGS

The present invention may be understood, and its numerous objects, features and advantages obtained, when the following detailed description is considered in conjunction with the following drawings, in which.

Figure 1:
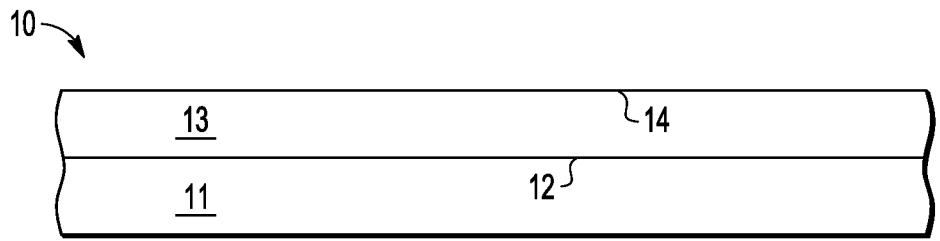
FIG. 1 is a simplified partial cross-sectional view of a semiconductor structure having an epitaxial substrate layer.

It will be appreciated that for simplicity and clarity of illustration, elements illustrated in the drawings have not necessarily been drawn to scale. For example, the dimensions of some of the elements are exaggerated relative to other elements for purposes of promoting and improving clarity and understanding. Further, where considered appropriate, reference numerals have been repeated among the drawings to represent corresponding or analogous elements.

DETAILED DESCRIPTION

A high voltage transistor switch device and associated fabrication process are described for providing very low off-state gate and drain leakage currents by separately implementing a mesa isolation process and ion implantation isolation process so that the ion implantation is implemented with a separate, smaller implant mask so that the resulting implant isolation regions isolate the side walls of mesa islands to ensure gate electrodes are not in contact with the edge of the channel layer, such as a Gallium nitride (GaN) channel layer, thereby reducing the gate leakage around the side walls of mesa islands. By integrating the isolation implant into the process flow after the source/drain ohmic alloy process, the insulating properties of the resulting implant isolation regions are preserved to provide isolation between devices, while allowing relatively high ohmic alloying temperatures to be used to achieve consistently good ohmic contacts. The sequencing of the ion implantation isolation process after device surface passivation also isolates any leakage path at the interface between the passivation film and the wafer surface. The disclosed GaN-on-silicon switch devices and associated method of fabrication provide improved semiconductor devices, especially transistors and arrays of transistors, that overcome the problems in the art, such as outlined above.

Various illustrative embodiments of the present invention will now be described in detail with reference to the accompanying figures. While various details are set forth in the following description, it will be appreciated that the present invention may be practiced without these specific details, and that numerous implementation-specific decisions may be made to the invention described herein to achieve the device designer's specific goals, such as compliance with process technology or design-related constraints, which will vary from one implementation to another. While such a development effort might be complex and time-consuming, it would nevertheless be a routine undertaking for those of ordinary skill in the art having the benefit of this disclosure. For example, selected aspects are depicted with reference to simplified cross sectional drawings of a semiconductor device without including every device feature or geometry in order to avoid limiting or obscuring the present invention. Such descriptions and representations are used by those skilled in the art to describe and convey the substance of their work to others skilled in the art. In addition, although specific example materials are described herein, those skilled in the art will recognize that other materials with similar properties can be substituted without loss of function. It is also noted that, throughout this detailed description, certain materials will be deposited, grown, etched, masked and/or removed to fabricate the semiconductor structure. Where the specific procedures for forming or removing such materials are not detailed below, conventional techniques to one skilled in the art for growing, depositing, removing or otherwise forming such layers at appropriate thicknesses shall be intended. Such details are well known and not considered necessary to teach one skilled in the art of how to make or use the present invention.

FIG. 1 is a simplified partial cross-sectional view of a semiconductor wafer structure 10 having an epitaxial substrate layer 13 formed over a substrate layer 11. Depending on the type of transistor device being fabricated, the substrate layer 11 may be implemented as a bulk insulator substrate, a bulk metal substrate, a bulk silicon substrate, single crystalline silicon (doped or undoped), semiconductor-on-insulator (SOI) substrate, a multi-layered composite film wafer substrate or any material including, for example, Si, SiC, SiGe, SiGeC, Ge, GaAs, InAs, InP, sapphire, diamond, GaN, or AlN, as well as other Group III-IV compound semiconductors or any combination thereof.

The wafer structure 10 includes an optional nucleation layer 12 formed (e.g. grown or deposited) on the substrate 11. The nucleation layer 12 may be implemented as GaN or AlGaN, AlN or the combination thereof that is provided on the surface of the substrate layer 11 prior to formation of a GaN epitaxial substrate layer 13 to induce the epi substrate layer 13 to form a crystalline structure, such as a single crystal substrate layer 13.

The wafer structure 10 also includes an epitaxial substrate layer 13 formed (e.g. grown or deposited) on or over the substrate 11 to a predetermined thickness. The epitaxial substrate layer 13 may be implemented with gallium nitride (GaN) and/or aluminum nitride (AlN) or any alloys such as aluminum gallium nitride (AlGaN), indium gallium nitride (InGaN), and aluminum indium gallium nitride (AlInGaN). These materials are semiconductor compounds that have a relatively wide, direct bandgap which permits highly energetic electronic transitions to occur. Gallium nitride materials have a number of attractive properties including high electron mobility, the ability to efficiently emit blue light, the ability to transmit signals at high frequency, and others. Accordingly, gallium nitride materials are being widely investigated in many microelectronic applications such as transistors and optoelectronic devices. As illustrated, the substrate layer 13 may be formed with an epitaxial growth process that is seeded from a seed or nucleation layer 12 on the substrate 11 so that the epi substrate layer 13 is formed. In selected embodiments, the epitaxial substrate layer 13 is formed on surface 12 of substrate 11 by, for example, Metal-Organo Chemical Vapor Deposition (MOCVD) or Molecular Beam Epitaxy (MBE), with MOCVD being preferred for GaN. As described herein and understood by those skilled in the art, the process of forming an epitaxial layer may be described as either depositing or growing a layer so that the "growth" and "deposition" terms are used interchangeably in this respect. As formed, the predetermined thickness of the epitaxial substrate layer 13 may be in the range of approximately 1 to 5 micrometers, preferably about 3 to 5 micrometers, but thicker and thinner layers may also be used.

Figure 2:
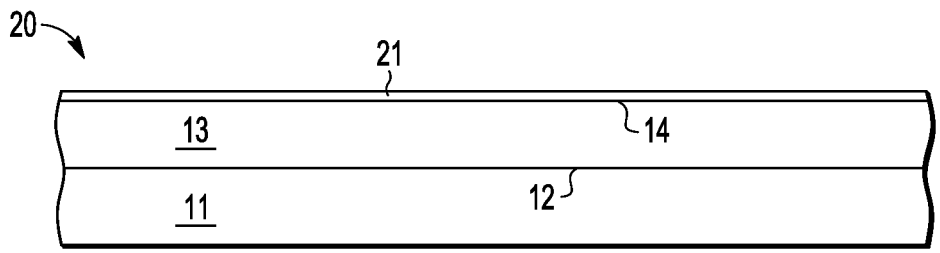
FIG. 2 illustrates processing of the semiconductor structure subsequent to FIG. 1 after a first passivation layer is formed over the semiconductor structure.

FIG. 2 illustrates processing of the semiconductor structure 20 subsequent to FIG. 1 after a first passivation layer 21 is formed. The first passivation layer 21 may be implemented with any desired insulating or dielectric material, such as $Si_3N_4$ (silicon nitride), $SiO_2$, $SiO_xN_y$, AlN, $Al_2O_3$, and/or other suitable combinations or mixtures thereof. The first passivation layer 21 may be formed by depositing $Si_3N_4$ on the surface 14 of the epi substrate layer 13 by chemical vapor deposition (CVD), plasma enhanced chemical vapor deposition (PECVD), physical vapor deposition (PVD), atomic layer deposition (ALD), evaporation, sputtering or other well-known techniques. In selected embodiments, the first passivation layer 21 is formed using CVD, preferably having low hydrogen content, to a predetermined thickness (e.g., in the range of approximately 200 to 5000 Angstrom, and more particularly about 500 Angstroms), though other thicknesses and materials can be used. As will be appreciated, the choice of material for first passivation layer 21 will depend upon the choice of material for epi substrate layer 13 and may be selected to render the surface 14 of the epi substrate layer 13 stable and having appropriate electrical properties (e.g., charged or neutral without significant surface states) during subsequent processing steps. In selected embodiments, the formation of the passivation layer 21 will reduce leakage current in the finally formed device by properly preparing the surface of the epi GaN layer 13 for deposition, and then depositing a silicon nitride film 21 having a low hydrogen content to prevent a leakage current path from forming at the passivation film and epi surface.

Figure 3:
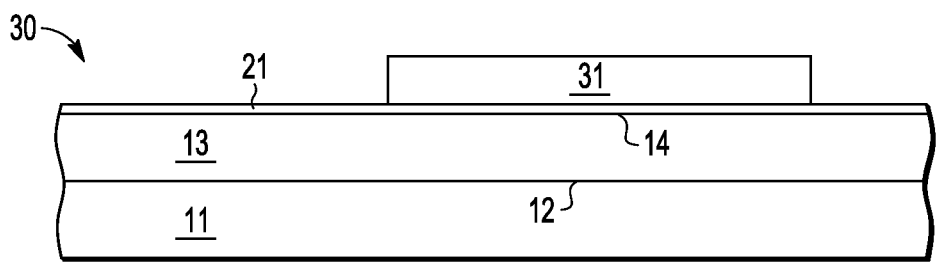
FIG. 3 illustrates processing of the semiconductor structure subsequent to FIG. 2 after a patterned etch mask is formed.

FIG. 3 illustrates processing of the semiconductor structure 30 subsequent to FIG. 2 after a patterned etch mask 31 is formed. In selected embodiments, the etch mask 31 is formed by depositing and patterning a layer of photoresist 31 to define and expose the exposed passivation layer(s) 21. Alternatively, the etch mask 31 may be formed by depositing and selectively etching one or more mask layers (e.g., silicon nitride) over the semiconductor structure 30 which may or may not include the passivation layer 21. By depositing a nitride layer over the epitaxial substrate layer 13 which is then patterned (e.g., with photoresist) and etched, an etch mask 31 may be formed over the intended device mesa area.

Figure 4:
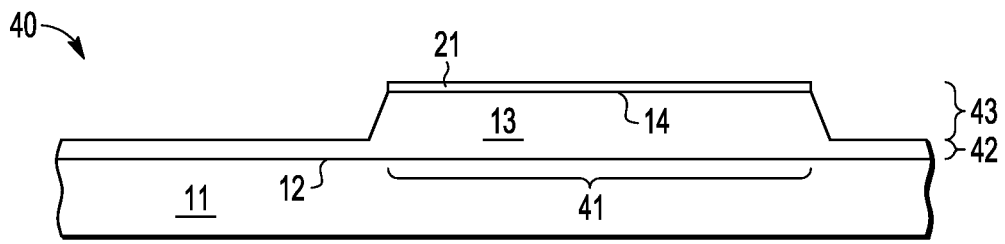
FIG. 4 illustrates processing of the semiconductor structure subsequent to FIG. 3 after a mesa etch is performed on the semiconductor structure to form an elevated mesa.

FIG. 4 illustrates processing of the semiconductor structure 40 subsequent to FIG. 3 after a mesa etch is performed to form an elevated mesa 41. Depending on the constituent materials and dimensions of the underlying layer(s) 13, 21, the mesa etch process may use one or more etch processes to form the elevated mesa 41, including a dry etching process (such as reactive-ion etching, ion beam etching, plasma etching, laser etching), or any combination thereof. For example, the patterned photoresist etch mask 31 may be used to expose and selectively remove the first passivation layer 21 from outside the intended mesa area(s), and then the patterned photoresist etch mask 31 may be removed or stripped with an appropriate etch chemistry to leave the remnant passivation layer 21 as a mesa etch mask. Alternatively, a patterned nitride etch mask may be formed directly on the epi substrate layer 13 to expose and selectively remove the epi substrate layer 13 from outside the intended mesa area(s) during the mesa, and then the patterned photoresist etch mask 31 may be removed or stripped with an appropriate etch chemistry to leave the remnant passivation layer 21 as a mesa etch mask. In this stage, the patterned etch mask 31 and/or remnant passivation layer 21 prevents the etch process from removing the protected portion of the epi substrate layer 13, resulting in the formation of the elevated mesa area 41. For convenience of illustration, only a single elevated mesa area 41 is shown, but it will be appreciated that multiple mesas 41 may be formed in the semiconductor structure. It will also be appreciated that the mesa sidewalls be substantially vertical or sloped, depending on the anisotropic nature of the mesa etch process. The depicted elevated mesa 41 includes an upper portion 43 which provides device to device isolation for field effect transistor devices formed therein. In addition, each elevated mesa 41 includes a lower portion 42 that provides a transition zone so that crystalline imperfections that may arise at interface surface 12 between the substrate layer 11 and the epitaxial substrate layer 13 do not significantly detract from device performance.

Figure 5:
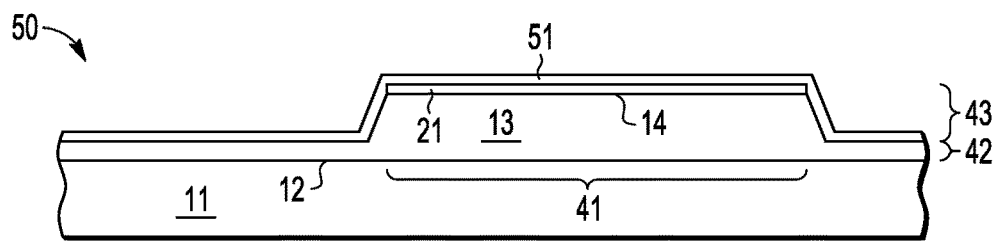
FIG. 5 illustrates processing of the semiconductor structure subsequent to FIG. 4 after a second passivation layer is formed over the semiconductor structure.

FIG. 5 illustrates processing of the semiconductor structure 50 subsequent to FIG. 4 after a second passivation layer 51 is formed. The second passivation layer 51 may be implemented with any desired insulating or dielectric material having low hydrogen content (e.g., $Si_3N_4$, $SiO_2$, $SiO_xN_y$, AlN, $Al_2O_3$, and/or other suitable combinations or mixtures thereof) that is deposited (e.g., by conformal CVD, PECVD, PVD, ALD, evaporation, sputtering, etc.) to a predetermined thicknesses (e.g., in the range of approximately 200 to 5000 Angstrom, and more particularly about 500 Angstroms), though other thicknesses and materials can be used. As formed, the second passivation layer 51 overlies at least the elevated device mesa(s) 41, and may also be formed on the mesa sidewalls and any exposed portions of the etched epitaxial substrate layer 13.

Figure 6:
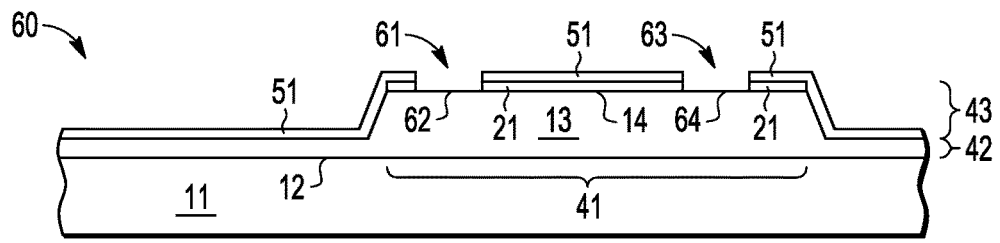
FIG. 6 illustrates processing of the semiconductor structure subsequent to FIG. 5 after source and drain contact openings are formed.

FIG. 6 illustrates processing of the semiconductor structure 60 subsequent to FIG. 5 after source and drain contact openings 61, 63 are formed with a selective etch process(es). Though not shown, it will be appreciated that the source and drain regions are already formed in the elevated device mesa using any desired patterned masking and implantation or diffusion process. Depending on the number of type of layers formed on top of the elevated device mesa(s) 41, one or more contact etch processes may be applied (such as reactive-ion etching, ion beam etching, plasma etching, laser etching, or the like) to form the source contact opening 61 and drain contact opening 63 through layers 21, 51 to expose the surface region locations 62, 64 desired for the intended source and drain regions in the elevated device mesa(s) 41. In selected embodiments, the source and drain contact openings 61, 63 are formed by using a patterned photoresist or etch mask layer (not shown) as a mask to etch openings 61, 63 with a suitable selective etch chemistry.

Figure 7:
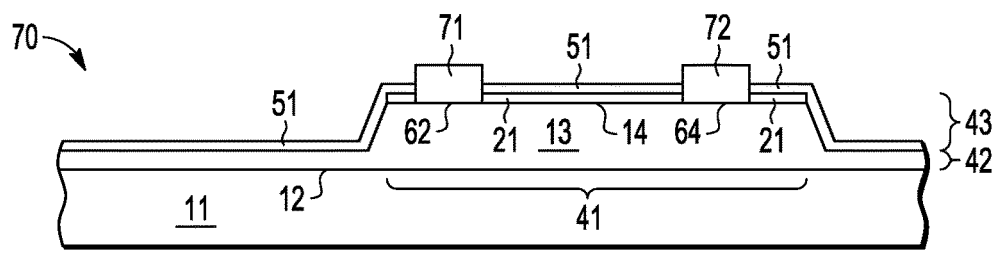
FIG. 7 illustrates processing of the semiconductor structure subsequent to FIG. 6 after source and drain ohmic contacts are formed.

FIG. 7 illustrates processing of the semiconductor structure 70 subsequent to FIG. 6 after formation of source and drain ohmic contacts 71, 72. At this stage, the source and drain contacts may be formed with any desired contact formation sequence, including but not limited to using a lift-off process which uses the same patterned photoresist or etch mask layer used to form source and drain contact openings 61, 63. Alternatively, any desired metal deposition and masking and etching sequence may also be used to form the contacts 71, 72 with one or more ohmic metal contact layers. When GaN is used for epitaxial substrate layer 13, the ohmic contacts 71, 72 may be formed as layered TiAl-MoAu or TiAlNiAu layers formed by evaporation with the Ti layer in contact with the epitaxial substrate layer 13, though other metal combinations and formation procedures can be used. Once deposited, patterned and etched, the ohmic contacts 71, 72 may be annealed as one or more alloy layers to provide ohmic contact to the channel using any desired anneal process, such as a furnace or rapid thermal anneal (RTA), where the anneal can be performed at this step or at any other step in the process preceding the formation of the isolation implant regions.

Figure 8:
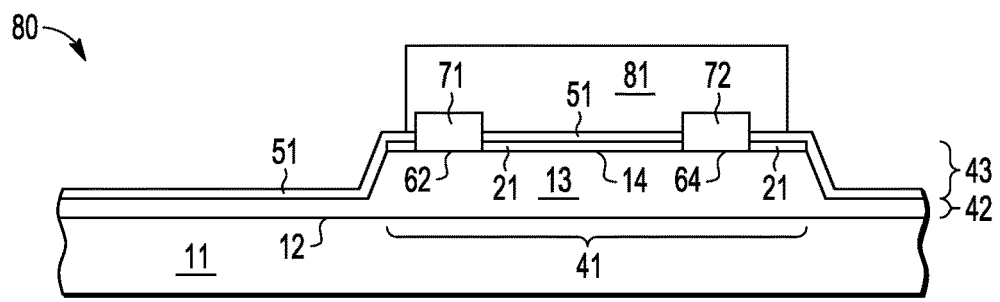
FIG. 8 illustrates processing of the semiconductor structure subsequent to FIG. 7 after an isolation implant mask is formed over the semiconductor structure to leave exposed peripheral sides of the mesa.

FIG. 8 illustrates processing of the semiconductor structure 80 subsequent to FIG. 7 after an isolation implant mask 81 is formed over the semiconductor structure to leave exposed peripheral sides of the mesa 41. As illustrated, the implant mask 81 may be formed by depositing and patterning a layer of photoresist 81 to define and expose the second passivation layer 51 on the mesa sidewalls and in the mesa "valley," while covering and protecting the elevated device mesa(s) 41 and the ohmic contacts 71, 72 formed therein. Alternatively, the implant mask 81 may be formed by depositing and selectively etching one or more mask layers (e.g., silicon nitride) over the elevated device mesa(s) 41 which may or may not include the passivation layer 51. However formed, the implant mask 81 is patterned and defined as a separate mask from the mesa etch mask 31 to leave exposed the peripheral sides of the mesa by a predetermined distance on each side (e.g., by at least 2 um). In contrast to fabrication processes which use the same mask for both mesa patterning and isolation implant, the implant mask 81 may be purposely offset and reduced from mesa etch mask 31 by at least 2 um on all the sides, thereby reducing size of the masked area in both x (laterally on the figure) and y (into the figure) directions.

Figure 9:
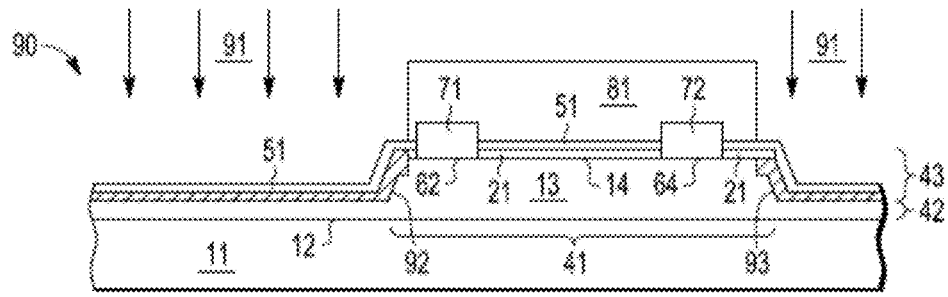
FIG. 9 illustrates processing of the semiconductor structure subsequent to FIG. 8 after isolation regions are implanted using the isolation implant mask.

FIG. 9 illustrates processing of the semiconductor structure 90 subsequent to FIG. 8 after isolation regions 92, 93 are formed into the epi substrate layer 13 using the isolation implant mask 81. In selected embodiments, the isolation regions 92, 93 may be formed by implanting 91 any desired species of material into the exposed (unmasked) regions of the epi substrate layer 13 to generate defects (e.g., vacancies) and/or an amorphous crystal structure therein, including but not limited to implanting disruptive species (e.g., nitrogen ions, argon ions, helium ions, oxygen ions, or other inert implant species) at a predetermined implant energy and dopant concentration (e.g., at least approximately $10^9$ atoms/$cm^3$) so as to form isolation regions 92, 93 in an upper portion of the exposed (unmasked) regions of the epi substrate layer 13 where the implanted ions are incorporated into the structure of the isolation regions 92, 93. As formed, the implant isolation regions 92, 93 electrically isolate the active region in the upper portion 43 of the elevated device mesa(s) 41 to limit leakage current flow from outside the active region to conducting structures on the device mesa(s) (e.g., gate and drain electrodes, contact pads of the source, drain and gate electrodes, and active regions of adjacent device(s) formed on the same substrate). As will be appreciated, the isolation regions 92, 93 generally have an electrical isolation property with a sheet resistance of at least about $10^9$ Ohms/sq. When an implant process 91 is used, the isolation regions 92, 93 have a high vacancy concentration (e.g., greater than about $10^{18}$ to $10^{20}$ vacancies/cm$^3$) or crystalline defects which limits, or prevents, the transport of free carriers (e.g., electrons or holes) which contribute to the conductivity of the material.

By forming the implant mask 81 to be offset into the active region of the elevated mesa on all the sides, the active region is reduced by the encroachment of the isolation regions 92, 93 up the mesa sidewalls and onto the exposed peripheral sides of the mesa both x (laterally on the figure) and y (into the figure) directions. In this way, the peripheral edges of the device mesa(s) 41, including the mesa side wall, are insulated by the isolation regions 92, 93 so that subsequently formed gate electrodes do not contact the epitaxial channel layer 13. And by forming the implant isolation regions 92, 93 after forming the passivation layer(s) and ohmic alloying processing which involve one or more high thermal budget process steps typically ranging from 800-850° C., the isolation properties of the regions 92, 93 are preserved and not diminished by the anneal step(s) which can anneal out the defects created by ion implant and thereby reduce the effectiveness of isolation implant.

Figure 10:
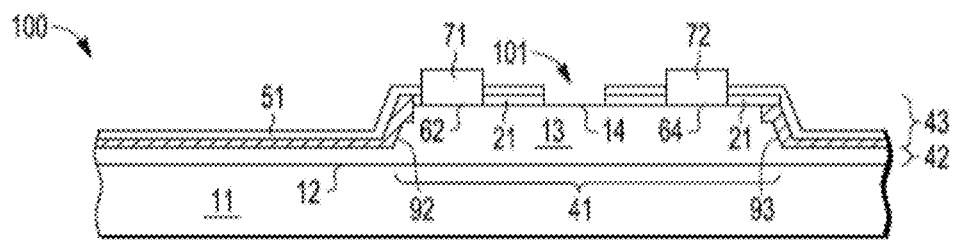
FIG. 10 illustrates processing of the semiconductor structure subsequent to FIG. 9 after the isolation implant mask is removed and gate openings are formed.

FIG. 10 illustrates processing of the semiconductor structure 100 subsequent to FIG. 9 after the isolation implant mask 81 is removed and gate openings 101 are formed with a selective etch process(es). Depending on the number of type of layers formed on top of the elevated device mesa(s) 41, one or more gate opening or via etch processes may be applied (such as reactive-ion etching, ion beam etching, plasma etching, laser etching, or the like) through layers 21, 51 to form the gate openings 101 at the intended channel regions in the upper portion 43 of the elevated device mesa(s) 41. In selected embodiments, the gate openings 101 are formed by using a patterned photoresist or etch mask layer (not shown) as a mask to etch gate openings 101 with a suitable selective etch chemistry. Though not shown, it will be appreciated that one or more gate dielectric layers may be exposed by the gate openings 101 which were previously formed on the elevated device mesa in the intended channel regions using any desired deposition sequence, though the gate dielectric layer(s) are not necessarily formed on the elevated device mesa(s).

Figure 11:
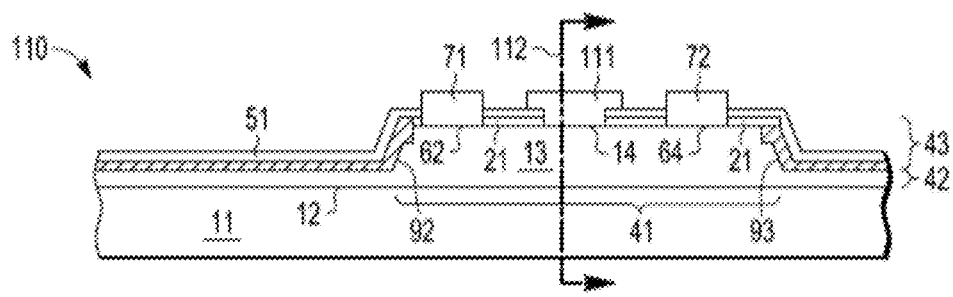
FIG. 11 illustrates processing of the semiconductor structure subsequent to FIG. 10 after one or more patterned gate layers are formed.

FIG. 11 illustrates processing of the semiconductor structure 110 subsequent to FIG. 10 after one or more patterned gate contact and conductor layers 111 are formed. At this stage, the patterned gate contact and conductor layers 111 may be formed by depositing one or more gate insulator layer or conductor layers (e.g. oxide, $Al_2O_3$, $HfO_2$ and/or metal layers) over the semiconductor structure 110 and in the gate opening 101, to form either MESFET, MOSFET or MISFET devices, followed by forming a patterned photoresist etch mask (not shown) and selectively etching the gate conductor layer(s) to define the lateral extent of gate conductor 111. As formed, the one or more patterned gate layers 111 may be defined and etched to overlap on either side with the passivation layers 21, 51. In selected embodiments, one or more initial gate contact layers (e.g., NiAu or PtAu) are formed or deposited in the gate openings 101 to provide a suitable gate contact for an underlying epi GaN substrate layer 13 by depositing approximately 200 to 400 Angstroms of Ni or Pt in the gate openings 101 to provide the desired gate contact, surmounted by several thousand Angstrom units of Au to provide lower resistance, but other metals, semi-metals, semiconductors and combinations thereof can also be used to form the gate contact 111. In addition or in the alternative, additional gate conductor layers, such as polysilicon, may be deposited in the gate openings 101, patterned and etched to form the final gate conductor 111. Though not shown, additional interconnect layers may be formed to complete the gate, source, and drain electrodes using any desired metallization, masking and etching steps.

Figure 12:
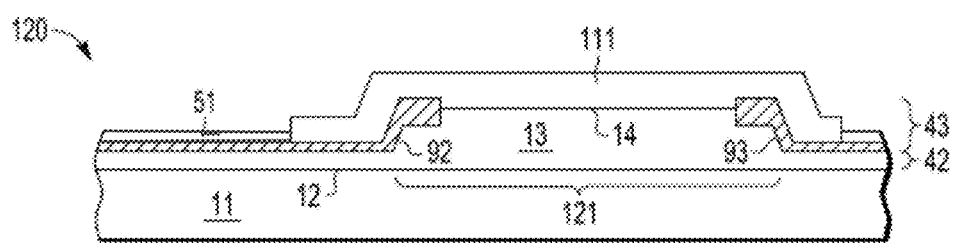
FIG. 12 illustrates a side view of the semiconductor structure shown in FIG. 11.

As described herein, the sequencing and placement of the isolation implant regions 92-93 are controlled to isolate not only the mesa "valley" regions, but also the side walls of the elevated mesa islands and the peripheral sides of the mesa 41 that are exposed by the isolation implant mask 81. As depicted in FIG. 11, the formation of the isolation implant regions 92-93 ensures that the source and drain electrodes 71, 72 do not contact the edge of the elevated epi GaN substrate layer 13. And as shown in FIG. 12 which illustrates a side view 112 of the semiconductor structure 120 shown in FIG. 11, the positioning of the isolation implant regions 92-93 also ensures that the gate electrode 111 is not in contact with the edge of GaN epi channel layer 13. In the depicted cross-section 112 of the gate conductor 111 which extends between the source and drain contact/regions 71, 72, the gate conductor 111 does not contact the edge of the GaN epi channel layer in the elevated mesa, but instead contacts the isolation implant regions 92-93 formed on the side walls of the elevated mesa islands and the peripheral sides of the mesa 41.

Figure 13:
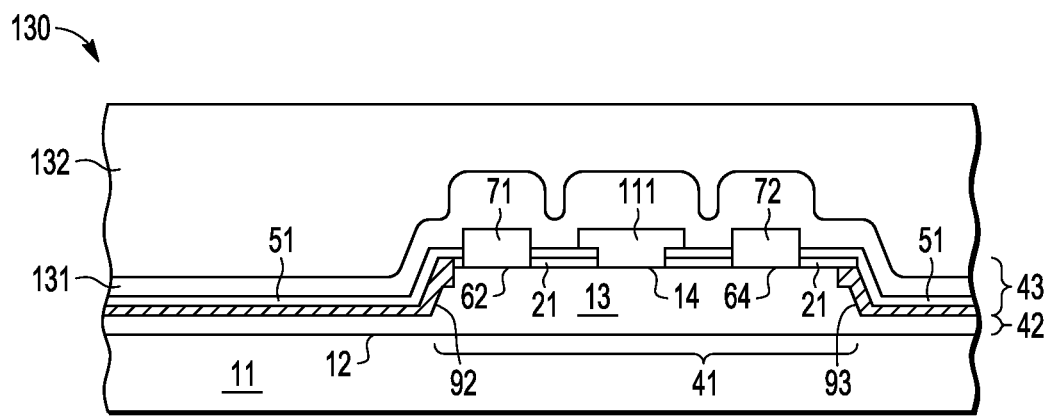
FIG. 13 illustrates processing of the semiconductor structure subsequent to FIG. 11 after one or more dielectric and/or passivation layers are formed.

FIG. 13 illustrates processing of the semiconductor structure 130 subsequent to FIG. 11 after one or more dielectric and/or passivation layers are formed. In an example implementation, one or more passivation layers 131 may be formed (e.g., by conformal CVD, PECVD, PVD, ALD, evaporation, sputtering, etc.) to a predetermined thicknesses to cover the semiconductor structure 130. In selected embodiments, the initial passivation layer(s) 131 are formed as an inter-layer dielectric (ILD) with a material having low hydrogen and low ionic or electronic charge content. In addition, one or more protection layers 132 may also be formed as a passivation layer at the end of the front end processing after formation of additional metal layers. As will be appreciated, the passivation layer 132 may be formed (e.g., by conformal CVD, PECVD, PVD, ALD, evaporation, sputtering, etc.) as a relatively thick, low stress and low charge layer 132.

Figure 14:
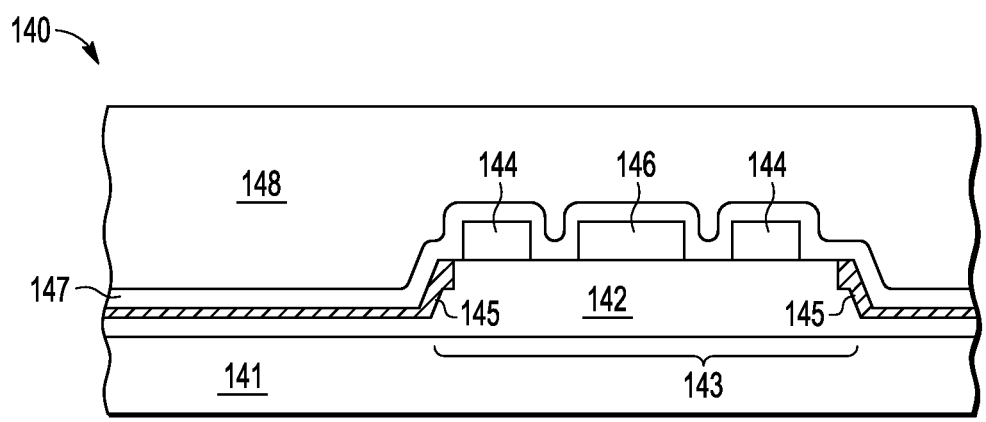
FIG. 14 is a simplified partial cross-sectional view of a semiconductor structure in which ohmic contact source/drain and gate contacts are formed on a mesa having implanted isolation regions without etching passivation layers.

While selected embodiments are described herein with reference to a fabrication sequence which uses one or more silicon nitride passivation layers 21, 51, the formation and selective etching of these passivation layers is not required in all embodiments. For example, reference is now made to FIG. 14 which depicts a simplified partial cross-sectional view of a semiconductor structure 140 in which ohmic contact source/drain contacts 144 and gate contacts 146 are formed on a mesa 142 having implanted isolation regions 144 without etching passivation layers. In fabricating the depicted semiconductor structure 140, a semiconductor substrate 141 having an epitaxial substrate layer 142 is selectively etched (e.g., with mesa etch mask formed directly on the epi layer 142 without an intervening passivation layer) to form one or more device mesas 143. Subsequently, source and drain ohmic contacts 144 may be formed in the one or more device mesas 143 without an intervening passivation layer, and an isolation implant mask (e.g., with implant mask formed directly on the epi layer 142 without an intervening passivation layer) is used to implant isolation regions 145 at the periphery of the device mesa(s) 143. In addition, or more patterned gate layers 146 are formed directly on the epi layer 142 without requiring the etch of any intervening passivation layer. While the source/drain contacts 144 and gate contacts 146 may be formed directly on a mesa 142 using any desired technique, in selected embodiments, a patterned photoresist masks may be used to selectively form the source/drain contacts 144 (and/or the gate contacts 146) on which the contact layers are formed so that any contact layers formed over the photoresist layer may be removed while retaining the contact layers in the openings in the patterned photoresist mask. Finally, one or more dielectric and/or passivation layers 147, 148 are selectively formed or deposited to cover the semiconductor structure 140. In selected embodiments, a first ILD layer 147 is formed by depositing a relatively thin layer of material having low hydrogen and low ionic or electronic charge content. In addition, an overall protection layer 148 is formed as a relatively thick, low stress and low charge layer that is planarized at the end of the front end process.

Figure 15:
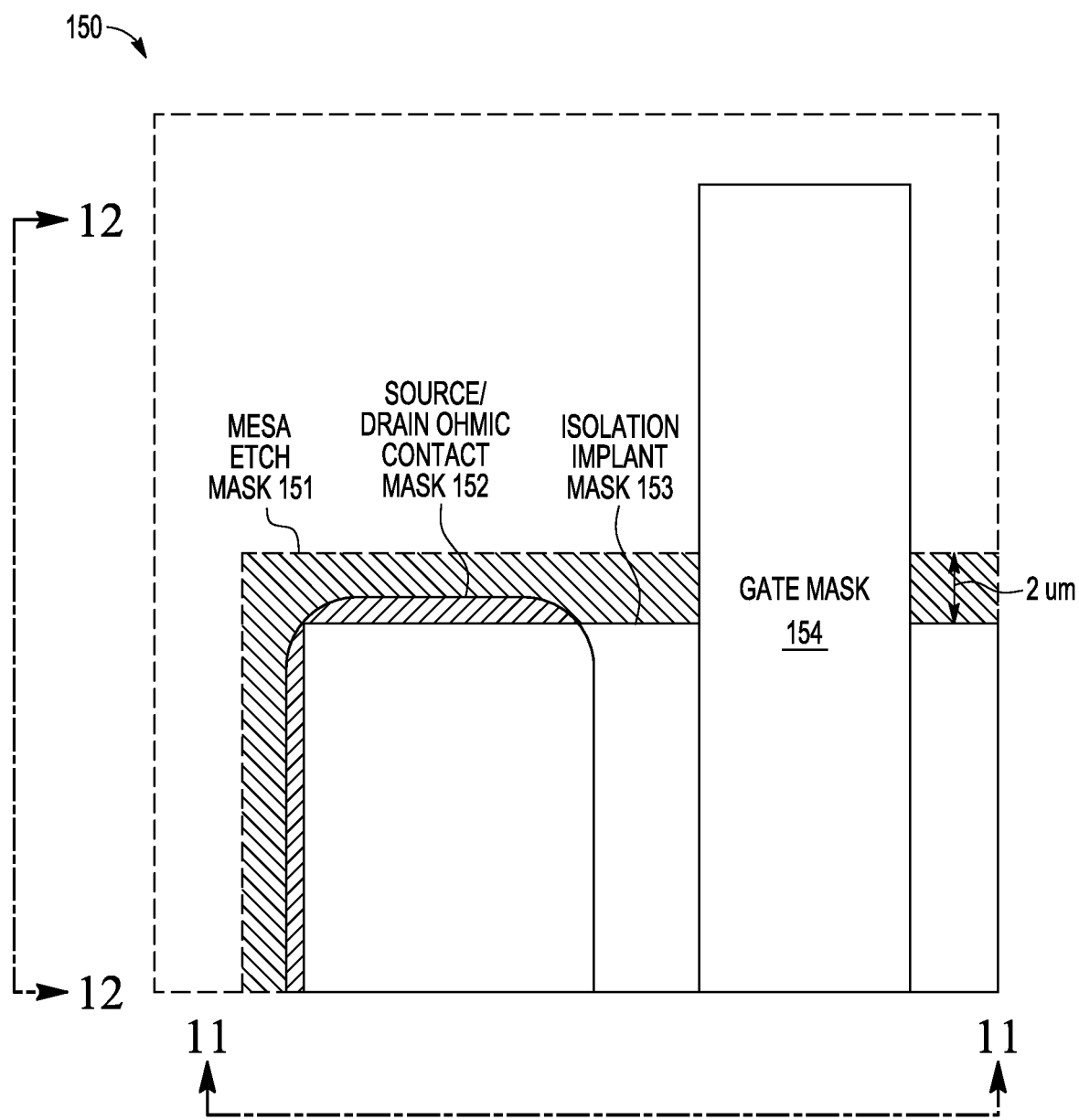
FIG. 15 illustrates a partial overlay plan view of the masks used to form the implant isolation regions on an elevated mesa device.

To further illustrated selected embodiments of the present invention, reference is now made to FIG. 15 which depicts a partial overlay plan view 150 of the masks used to form the implant isolation regions on an elevated mesa device such as illustrated in FIGS. 1-12. For purposes of general orientation, the depicted x-dimension (horizontal) and y-dimension (vertical) in FIG. 15 correspond in part to the cross-sectional views of FIGS. 11 and 12, respectively. Thus, the mesa etch mask 151 corresponds generally to the patterned etch mask 31 shown in FIG. 3, the source/drain ohmic contact mask 152 corresponds generally to the etch mask used to form source and drain contact openings 61, 63, the isolation implant mask 153 corresponds generally to the isolation implant mask 81 shown in FIG. 8, and the gate mask 154 corresponds generally to the etch mask used to form the gate opening 101 shown in FIG. 10. As depicted, the isolation implant mask 153 is patterned and defined as a separate mask from the mesa etch mask 151 to leave exposed the peripheral sides of the mesa by a predetermined distance on each side (e.g., by at least 2 microns). And while the source/drain ohmic contact mask 152 is shown as extending past the outer edges of the isolation implant mask 153, it will be appreciated that the source/drain ohmic contact mask 152 could be shrunk or reduced in size so the source/drain contacts will be totally covered by the isolation implant photoresist mask 153 during implant. Even if the masks shown in FIG. 15 are used, the left side of the device (contact) is not affected since the electrons do not go in that direction, and device conduction is still preserved since electrons travel from one contact, go under the gate and reaches the other contact. As a result, device operation is not impaired, and the device size is effectively reduced by 4 um (2+2) in the vertical or y-direction.

Figure 16:
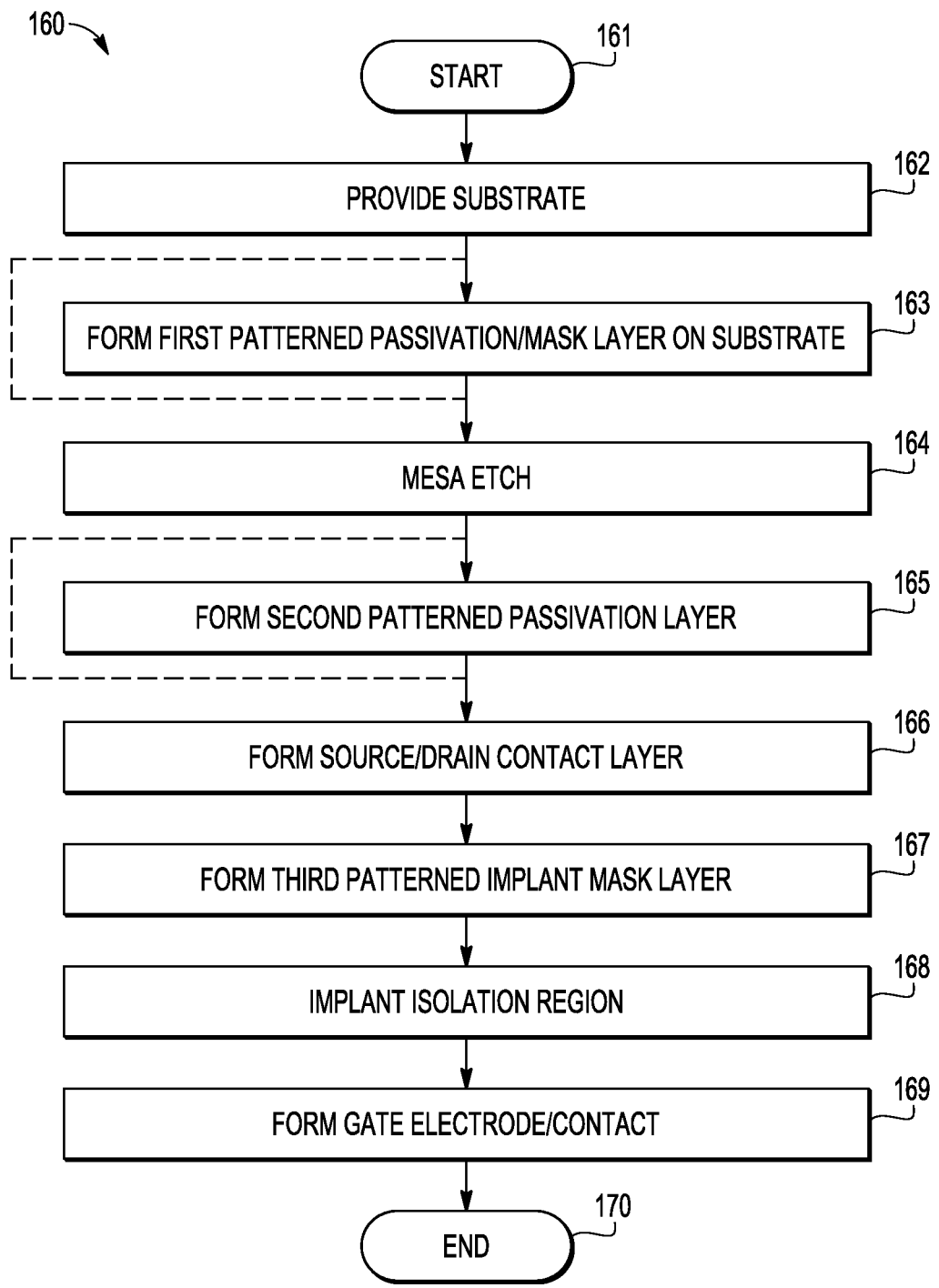
FIG. 16 is a simplified schematic flow chart illustrating various methods for fabricating devices in accordance with selected embodiments of the invention.

FIG. 16 is a simplified schematic flow chart illustrating various methods 160 for fabricating devices in accordance with selected embodiments of the invention. In describing the fabrication methodology 160, the description is intended merely to facilitate understanding of various exemplary embodiments and not by way of limitation. Unless otherwise indicated, subsequent steps may be provided in any desired order.

Once the fabrication methodology starts (step 161), a semiconductor substrate layer is provided at step 162 which has a first conductivity type and doping concentration.

At step 163, a first patterned passivation/mask layer may be formed by first depositing any desired insulating or dielectric material, such as $Si_3N_4$ (silicon nitride), $SiO_2$, $SiO_xN_y$, AlN, $Al_2O_3$, and/or other suitable combinations or mixtures thereof, using CVD, PECVD, PVD, ALD), evaporation, sputtering or other well-known techniques. In selected embodiments, a first passivation layer is formed with a material that is selected to reduce leakage current in the finally formed device by properly preparing the surface of the underlying epi GaN substrate layer for deposition, and then depositing a silicon nitride film having a low hydrogen content to prevent a leakage current path from forming at the passivation film and epi surface. With the first passivation layer in place, a patterned etch mask layer is then formed to cover the intended device mesa areas, and then selectively etched to form the first patterned passivation/mask layer. In other embodiments, the passivation layer is not formed at all (as indicated by the dashed line bypassing step 163), and instead the etch mask is formed directly on the substrate, such as by depositing and selectively etching one or more mask layers over the semiconductor structure to cover the intended device mesa area.

At step 164, a mesa etch is performed using the patterned mask layer to form an elevated mesa in the upper portion of the substrate. Depending on the constituent materials and dimensions of the underlying layer(s), the mesa etch process may use a dry etching process (such as reactive-ion etching, ion beam etching, plasma etching, laser etching), or any combination thereof.

At step 165, a second patterned passivation layer may be formed. The second passivation layer may be implemented with any desired insulating or dielectric material having low hydrogen content (e.g., $Si_3N_4$, $SiO_2$, $SiO_xN_y$, AlN, $Al_2O_3$, and/or other suitable combinations or mixtures thereof) that is deposited (e.g., by conformal CVD, PECVD, PVD, ALD, evaporation, sputtering, etc.) to a predetermined thicknesses. As formed, the second passivation layer overlies at least the elevated device mesa(s), and may also be formed on the mesa sidewalls and any exposed portions of the etched epitaxial substrate layer. In other embodiments, the second passivation layer is not formed at all (as indicated by the dashed line bypassing step 165), and instead the fabrication process proceeds directly to step 166 for the formation of the source/drain contact layers on the elevated mesa devices.

At step 166, source and drain ohmic contacts are formed, either by selectively etching through the second passivation layer or directly on the elevated surface of the mesa devices. For example, a source/drain contact mask may be formed to selectively expose and remove the second passivation layer from the intended source/drain contact areas, followed by deposition of one or more ohmic contact layers in the contact openings. Alternatively, if there is no second passivation layer formed, the source and drain contacts may be formed using a lift-off process which uses a patterned photoresist or etch mask layer to form source and drain contact openings in which the source/drain contact layers are formed. Once deposited, patterned and etched, the source/drain ohmic contacts may be annealed as one or more alloy layers to provide ohmic contact to the channel using any desired anneal process, such as a furnace or rapid thermal anneal (RTA), where the anneal can be performed at this step or at any other step in the process preceding the formation of the isolation implant regions.

At step 167, a third patterned implant mask is formed over the semiconductor structure to leave exposed peripheral sides of the elevated mesa devices. While any desired mask formation process may be used, the etch mask may be formed by depositing and patterning a layer of photoresist to define and expose the second passivation layer (or elevated device mesa) on the mesa sidewalls and in the mesa "valley," while covering and protecting the elevated device mesa(s) and the source/drain ohmic contacts formed therein. Alternatively, the implant mask 81 may be formed by depositing and selectively etching one or more mask layers (e.g., silicon nitride) over the elevated device mesa(s) which may or may not include the passivation layer(s). However formed, the implant mask is patterned and defined as a separate mask from the mesa etch mask to leave exposed the peripheral sides of the mesa by a predetermined distance on each side (e.g., by at least 2 um). Of course, in other embodiments, different margins or distances may be exposed by the patterned implant mask At step 168, isolation regions are implanted into the epi substrate layer using the isolation implant mask to implant any desired species of material into the exposed (unmasked) regions of the epi substrate layer to generate defects (e.g., vacancies) and/or an amorphous crystal structure therein. By positioning the implant mask properly, the implanted isolation regions are formed in an upper portion of the exposed (unmasked) regions of the epi substrate layer where the implanted ions are incorporated into the structure of the isolation regions, thereby electrically isolating the active region in the upper portion of the elevated device mesa(s) to limit leakage current flow from outside the active region to conducting structures on the device mesa(s) (e.g., gate and drain electrodes, contact pads of the source, drain and gate electrodes, and active regions of adjacent device(s) formed on the same substrate).

At step 169, the gate electrode contact layers are formed, either by selectively etching through the remnant second passivation layer or directly on the elevated surface of the mesa devices. For example, a gate contact mask may be formed to selectively expose and remove the second passivation layer from the intended gate contact areas, followed by deposition of one or more gate contact layers in the gate contact openings. Alternatively, if there is no second passivation layer formed, the gate contacts may be formed using a lift-off process which uses a patterned photoresist or etch mask layer to form gate contact openings in which the gate contact layers are formed. And at step 170, the process ends.

By now it should be appreciated that there is provided herein a semiconductor structure and method for fabricating same. As disclosed, a semiconductor substrate (e.g., a GaN-on-Si substrate) is provided that has a first surface. On the first surface, a first passivation silicon nitride layer may be formed. In addition or in the alternative, a patterned mesa etch mask layer is formed on the first surface of the substrate, and the used to selectively remove portions of the substrate exposed by the mesa etch mask to form one or more mesa structures, each having exposed mesa sidewalls and an elevated surface still covered by the mesa etch mask layer. After removing the mesa etch mask, a second passivation silicon nitride layer may be formed on the elevated surface of the mesa structures. Subsequently, electrode contact openings are formed that expose the elevated surface of the mesa structures using a patterned electrode contact mask layer formed over at least the elevated surface of the mesa structures. In the electrode contact openings, one or more electrode conductor layers are formed in ohmic contact with the substrate. In selected embodiments, the electrode conductor layers are formed by depositing one or more source/drain ohmic metal contact layers in the electrode contact openings, and then annealing the one or more source/drain ohmic metal contact layers in the electrode contact openings to form one or more ohmic alloy layers in contact with the substrate. Subsequently, an implant mask layer is formed to protect an interior portion of the elevated surface of the mesa structures in which the one or more electrode conductor layers are formed while leaving exposed the mesa sidewalls and a peripheral region around each elevated surface of the mesa structures. In selected embodiments, either or both the mesa etch mask layer and the implant mask layer may be formed by depositing a passivation silicon nitride layer over the substrate. With the implant mask layer in place, one or more isolation regions are formed for each mesa structure by using the implant mask layer to implant ions into an upper portion of the mesa sidewalls and the peripheral region exposed by the implant mask layer. In selected embodiments, disruptive species are implanted at a predetermined implant energy and dopant concentration into the upper portion of the mesa sidewalls and the peripheral region exposed by the implant mask layer where the implanted disruptive species are incorporated into the structure of the isolation region. Finally, gate electrode contact openings are formed in the implant mask layer or a passivation layer over the intended channel regions at the elevated surface of the mesa structures using a patterned gate electrode contact mask layer formed over at least the elevated surface of the mesa structures, and one or more gate electrode conductor layers in the gate electrode contact openings.

In another form, there is provided a method of forming a low leakage current switching device. In the disclosed methodology, a substrate is provided that may include an upper layer of gallium nitride (GaN), aluminum nitride (AlN), aluminum gallium nitride (AlGaN), indium gallium nitride (InGaN), or aluminum indium gallium nitride (AlInGaN). One or more elevated mesas are formed in a substrate so that each elevated mesa has mesa sidewalls and an elevated surface. In selected embodiments, the elevated mesas are formed by providing a substrate and then forming a mesa etch mask on a principal surface of the substrate to protect one or more designated active areas, followed by partially etching portions of the substrate using the mesa etch mask to form one or more elevated mesas at the one or more designated active areas so that each elevated mesa has exposed mesa sidewalls and an elevated surface still covered by the mesa etch mask. After forming the elevated mesas, at least one source/drain substrate region and one or more associated ohmic contact layers are formed on an elevated surface of the one or more elevated mesas, such as by selectively forming one or more source/drain ohmic metal contact layers on the elevated surface of the one or more elevated mesas, and then annealing the one or more source/drain ohmic metal contact layers to form one or more ohmic alloy layers in contact with the substrate. In addition, a passivation layer may be formed over the substrate after forming the one or more elevated mesas by depositing a low hydrogen content layer of $Si_3N_4$, $SiO_2$, $SiO_xN_y$, AlN, $Al_2O_3$ using chemical vapor deposition (CVD), plasma enhanced chemical vapor deposition (PECVD), physical vapor deposition (PVD), atomic layer deposition (ALD), evaporation, or sputtering to a predetermined thicknesses of less than approximately 5000 Angstroms. Subsequent to forming the ohmic contact layers, an implant mask is formed to protect an interior portion of each elevated surface of the elevated mesa while leaving exposed the mesa sidewalls and a peripheral region around each elevated surface of the elevated mesa. Using the implant mask, an isolation region is formed for each elevated mesa by implanting ions into an upper portion of the mesa sidewalls and the peripheral region exposed by the implant mask layer, thereby forming the isolation region to extend into a portion of the elevated mesa. The isolation regions may be formed by implanting disruptive species at a predetermined implant energy and dopant concentration into the upper portion of the mesa sidewalls and the peripheral region exposed by the implant mask layer where the implanted disruptive species are incorporated into the structure of the isolation region. After forming the isolation region, one or more gate electrode conductor layers may be formed on an elevated surface of the one or more elevated mesas.

In yet another form, there is provided a semiconductor device and fabrication sequence for manufacturing same. The semiconductor device includes a semiconductor substrate with one or more elevated mesa structures defining one or more active areas and surrounded by one or more recessed areas in the substrate defining one or more inactive areas, each elevated mesa structure having mesa sidewalls and an elevated surface. In addition, the semiconductor device includes an implanted isolation region formed around each elevated mesa in the mesa sidewalls and in a peripheral edge region of the elevated surface adjacent the mesa sidewalls, where the implanted isolation region comprises an upper region of the semiconductor substrate having defects, vacancies and/or an amorphous crystal structure to provide isolation for the mesa sidewalls and peripheral edge region. In selected embodiments, the semiconductor device includes one or more insulating passivating layers on at least the elevated surface of the mesa structure. Finally, the semiconductor device includes one or more active semiconductor devices formed on at least the one or more elevated mesa structures.

Although the described exemplary embodiments disclosed herein are directed to low leakage current switch devices and methods for making same, the present invention is not necessarily limited to the example embodiments which illustrate inventive aspects of the present invention that are applicable to a wide variety of transistor fabrication processes and/or structures. Thus, the particular embodiments disclosed above are illustrative only and should not be taken as limitations upon the present invention, as the invention may be modified and practiced in different but equivalent manners apparent to those skilled in the art having the benefit of the teachings herein. For example, while the various devices illustrated herein are described with reference to switch devices formed on GaN-on-Si substrates, this is merely for convenience of explanation and not intended to be limiting and persons of skill in the art will understand that the principles taught herein apply to devices of either conductivity type. Accordingly, the identification of particular regions being formed with one type of material or another is merely by way of illustration and not limitation and other materials may be substituted in order to form devices. Moreover, the thicknesses and doping concentrations of the described layers or regions may deviate from the disclosed ranges or values. Accordingly, the foregoing description is not intended to limit the invention to the particular form set forth, but on the contrary, is intended to cover such alternatives, modifications and equivalents as may be included within the spirit and scope of the invention as defined by the appended claims so that those skilled in the art should understand that they can make various changes, substitutions and alterations without departing from the spirit and scope of the invention in its broadest form.

Benefits, other advantages, and solutions to problems have been described above with regard to specific embodiments. However, the benefits, advantages, solutions to problems, and any element(s) that may cause any benefit, advantage, or solution to occur or become more pronounced are not to be construed as a critical, required, or essential feature or element of any or all the claims. As used herein, the terms "comprises," "comprising," or any other variation thereof, are intended to cover a non-exclusive inclusion, such that a process, method, article, or apparatus that comprises a list of elements does not include only those elements but may include other elements not expressly listed or inherent to such process, method, article, or apparatus.

What is claimed is:

1. A semiconductor device, comprising:
a substrate comprising an elevated mesa island structure defining one or more active areas and surrounded by one or more recessed areas in the substrate defining one or more inactive areas, where the elevated mesa island structure has mesa sidewalls and an elevated surface;
an implanted isolation region formed around and completely surrounding the elevated mesa island structure in the mesa sidewalls and in at least a horizontal face of an electrically insulating peripheral edge region of the elevated surface adjacent the mesa sidewalls, where the implanted isolation region comprises an upper region of the substrate having defects, vacancies and/or an amorphous crystal structure to provide isolation for the mesa sidewalls and the electrically insulating peripheral edge region;
one or more insulating passivating layers formed on at least the mesa sidewalls and elevated surface of the elevated mesa island structure; and
active devices formed on the elevated mesa island structure that include one or more gate electrodes on the elevated surface of the mesa island structure, where the one or more gate electrodes overlap the electrically insulating peripheral edge region, and where the implanted isolation region extends beyond an end of the one or more gate electrodes.

2. The semiconductor device of claim 1, where the substrate comprises an epitaxial layer of gallium nitride (GaN), aluminum nitride (AlN), aluminum gallium nitride (AlGaN), indium gallium nitride (InGaN), or aluminum indium gallium nitride (AlInGaN).

3. The semiconductor device of claim 1, where the implanted isolation region extends on the elevated surface of the elevated mesa island structure by a first distance.

4. The semiconductor device of claim 1, where the active devices comprise one or more metal insulator semiconductor (MIS) transistors.

5. The semiconductor device of claim 1, further comprising:
one or more patterned current electrode layers formed on the elevated surface of the elevated mesa island structure.

6. A semiconductor device, comprising:
a gallium nitride substrate layer comprising an elevated mesa island structure defining one or more active areas and surrounded by one or more recessed areas in the substrate defining one or more inactive areas, where the elevated mesa island structure has mesa sidewalls and an elevated surface of the gallium nitride substrate layer that is vertically and laterally displaced from a lower upper facing surface of the gallium nitride substrate layer;

source/drain contacts on the elevated surface of the elevated mesa island structure;

an electrically insulating peripheral edge region around the elevated surface of the mesa island structure implanted with ions;

an implanted isolation region formed around and completely surrounding the elevated mesa island structure in the mesa sidewalls and in at least a horizontal face of a peripheral edge region of the elevated surface adjacent the mesa sidewalls, where the implanted isolation region comprises an upper region of the substrate having defects, vacancies and/or an amorphous crystal structure to provide isolation for the mesa sidewalls and peripheral edge region;

one or more insulating passivating layers formed on at least the mesa sidewalls and the elevated surface of the elevated mesa island structure; and active devices formed on the elevated mesa island structure that include one or more gate electrodes on the elevated surface of the mesa island structure, where the one or more gate electrodes overlap the peripheral edge region, and where the implanted isolation region extends beyond an end of the one or more gate electrodes.

7. The semiconductor device of claim 6, wherein the one or more insulating passivating layers formed on at least the elevated surface of the elevated mesa island structure prior to formation of the implanted isolation region.

8. The semiconductor device of claim 6, where the gallium nitride substrate layer comprises an epitaxial layer of gallium nitride (GaN).

9. The semiconductor device of claim 6, where the implanted isolation region extends on the elevated surface of the elevated mesa island structure by a first distance.

10. The semiconductor device of claim 6, where the active devices comprise one or more metal insulator semiconductor (MIS) transistors.

11. The semiconductor device of claim 6, further comprising [M] one or more patterned current electrode layers formed on the elevated surface of the elevated mesa island structure; and wherein the one or more gate electrode layers are one or more patterned gate electrode layers on the elevated surface of the elevated mesa island structure.

12. A semiconductor structure comprising:

a mesa island structure on a first surface of a gallium nitride substrate layer having tapered mesa sidewalls and an elevated surface of the gallium nitride substrate layer that is vertically and laterally displaced from a lower upper facing surface of the gallium nitride substrate layer;

one or more electrode conductor layers on the elevated surface of the mesa island structure electrically coupled to the gallium nitride substrate layer;

an electrically insulating peripheral edge region around the elevated surface of the mesa island structure implanted with ions; and an isolation region completely surrounding each mesa island structure implanted with ions in an upper portion of the tapered mesa sidewalls and in at least a horizontal face of the electrically insulating peripheral edge region;

one or more insulating passivating layers formed on at least the mesa sidewalls and the elevated surface of the elevated mesa island structure; and one or more gate electrodes on the elevated surface of the mesa island structure, where the one or more gate electrodes overlap the peripheral edge region, and where the implanted isolation region extends beyond an end of the one or more gate electrodes.

13. The semiconductor structure of claim 12, where the gallium nitride substrate layer comprises an epitaxial gallium nitride layer.

14. The semiconductor structure of claim 13, wherein the one or more insulating passivation layers comprises a first passivation silicon nitride layer on the first surface of the epitaxial gallium nitride layer formed prior to or as part of forming a mesa etch mask layer.

15. The semiconductor structure of claim 12, where the one or more electrode conductor layers comprise:

one or more current electrode ohmic metal contact layers in electrode contact openings formed on the elevated surface of the mesa structure; and one or more current electrode ohmic metal contact layers forming one or more ohmic alloy layers in contact with the substrate.

16. The semiconductor structure of claim 12, wherein the one or more insulating passivating layers comprise a first passivation silicon nitride layer on the elevated surface of the mesa island structure.

* * * * *